(12) United States Patent
Wuu et al.

(10) Patent No.: US 8,853,057 B2
(45) Date of Patent: Oct. 7, 2014

(54) METHOD FOR FABRICATING SEMICONDUCTOR DEVICES

(75) Inventors: Dong-Sing Wuu, Taichung (TW); Ray-Hua Horng, Taichung (TW)

(73) Assignee: National Chung-Hsing University, Taichung (TW)

( * ) Notice: Subject to any disclaimer, the term of this patent is extended or adjusted under 35 U.S.C. 154(b) by 435 days.

(21) Appl. No.: 13/242,362

(22) Filed: Sep. 23, 2011

(65) Prior Publication Data
US 2012/0077334 A1    Mar. 29, 2012

(30) Foreign Application Priority Data

Sep. 28, 2010  (TW) ............................... 99132768 A
Nov. 25, 2010  (CN) ........................... 2010 1 0558982

(51) Int. Cl.
| H01L 21/00 | (2006.01) |
| H01L 29/06 | (2006.01) |
| H01L 33/00 | (2010.01) |
| H01L 23/31 | (2006.01) |
| H01L 21/683 | (2006.01) |
| H01L 21/78 | (2006.01) |
| H01L 21/02 | (2006.01) |

(52) U.S. Cl.
CPC ........ *H01L 33/0095* (2013.01); *H01L 23/3171* (2013.01); *H01L 21/6835* (2013.01); *H01L 21/78* (2013.01); *H01L 21/02639* (2013.01)
USPC ........... 438/464; 438/481; 438/704; 257/622; 257/626; 257/E21.599

(58) Field of Classification Search
CPC ............ H01L 33/0095; H01L 23/3171; H01L 21/6835; H01L 21/78; H01L 21/02639
USPC .......... 438/464, 481, 689, 704; 257/622, 623, 257/626
See application file for complete search history.

(56) References Cited

U.S. PATENT DOCUMENTS

| 8,383,438 B2 * | 2/2013 | Xiong et al. ..................... 438/39 |
| 8,435,816 B2 * | 5/2013 | Xiong et al. ..................... 438/34 |
| 2001/0012677 A1 | 8/2001 | Sameshima |

(Continued)

FOREIGN PATENT DOCUMENTS

| TW | 533607 | 5/2003 |
| WO | 2007048346 | 5/2007 |

OTHER PUBLICATIONS

Search Report appended in an Office Action for corresponding Taiwanese Counterpart Application No. 099132768, issued on Jun. 12, 2014.

*Primary Examiner* — Alonzo Chambliss
(74) *Attorney, Agent, or Firm* — Duane Morris LLP

(57) ABSTRACT

A method for fabricating semiconductor devices includes: (a) forming a layered structure that includes a temporary substrate, a plurality of spaced apart sacrificial film regions on the temporary substrate, and a plurality of valley-and-peak areas among the sacrificial film regions; (b) growing laterally and epitaxially an epitaxial film layer over the sacrificial film regions and the valley-and-peak areas, wherein gaps are formed among the epitaxial film layer and the valley-and-peak areas; (c) forming a conductive layer to contact the epitaxial film layer; (d) forming a plurality of grooves to divide the epitaxial film layer and the conductive layer into a plurality of epitaxial structures on the temporary substrate; and (e) removing the temporary substrate and the sacrificial film regions from the epitaxial structures by etching the sacrificial film regions through the gaps and the grooves.

8 Claims, 17 Drawing Sheets

(56) References Cited

U.S. PATENT DOCUMENTS

| | | | |
|---|---|---|---|
| 2010/0219509 A1* | 9/2010 | He et al. | 257/618 |
| 2011/0140080 A1* | 6/2011 | Xiong et al. | 257/13 |
| 2011/0143467 A1* | 6/2011 | Xiong et al. | 438/29 |
| 2011/0227213 A1* | 9/2011 | Wuu et al. | 257/734 |

* cited by examiner

METHOD FOR FABRICATING SEMICONDUCTOR DEVICES

CROSS-REFERENCE TO RELATED APPLICATION

This application claims priority of Taiwanese application no. 099132768, filed on Sep. 28, 2010.

BACKGROUND OF THE INVENTION

1. Field of the Invention

This invention relates to a method for fabricating semiconductor devices, more particularly to a method for fabricating semiconductor devices with epitaxial structures.

2. Description of the Related Art

Currently, there are various semiconductor devices with epitaxial structures mainly manufactured through an epitaxial process. Taking an example of a vertical-conducting light-emitting diode (LED) shown in FIG. 1, the optoelectronic semiconductor device 1 comprises a conductive member 11, an epitaxial film layer 12 that is disposed on the conductive member 11 and that is to form an epitaxial structure 10 along with the conductive member 11, and an electrode 13 disposed on the epitaxial film layer 12 of the epitaxial structure 10. The epitaxial film layer 12 of the epitaxial structure 10 is formed through an epitaxial process. By virtue of electrical connection with the conductive member 11 and the electrode 13, electricity may be supplied to the epitaxial film layer 12 so that light may be emitted through an optoelectronic effect when the electricity is supplied to the epitaxial film layer 12.

When fabricating the optoelectronic semiconductor device 1 (i.e., the vertical-conducting LED), a sapphire ($Al_2O_3$) substrate, which has a better lattice match for an epitaxial film layer formed thereon and which is in the form of a wafer, and is selected to serve as a temporary substrate. Then, on the temporary substrate, the epitaxial film layer of gallium nitride (GaN) is epitaxially grown; a conductive layer serving as a permanent substrate is formed on the epitaxial film layer; and the temporary substrate is subsequently removed from the epitaxial film layer. Thereafter, a plurality of the electrodes are formed on a surface of the epitaxial film layer that is exposed after the temporary substrate is removed, followed by cutting into a plurality of the optoelectronic semiconductor devices 1.

In the above conventional process, the temporary substrate is removed from the epitaxial film layer using a laser lift-off process or a mechanical polishing process. However, the laser lift-off process involves relatively high fabrication costs. On the other hand, the mechanical polishing process is likely to induce residual stress that could damage the structure of the epitaxial film layer.

SUMMARY OF THE INVENTION

Therefore, an object of the present invention is to provide a method for fabricating semiconductor devices that can overcome the aforesaid drawbacks of the prior art.

According to the present invention, there is provided a method for fabricating semiconductor devices, comprising:

(a) forming a layered structure that includes a temporary substrate, a plurality of spaced apart sacrificial film regions on the temporary substrate, and a plurality of valley-and-peak areas among the sacrificial film regions;

(b) growing laterally and epitaxially an epitaxial film layer over the sacrificial film regions and the valley-and-peak areas, wherein gaps are formed among the epitaxial film layer and the valley-and-peak areas;

(c) forming a conductive layer to contact the epitaxial film layer;

(d) forming a plurality of grooves to divide the epitaxial film layer and the conductive layer into a plurality of epitaxial structures on the temporary substrate; and (e) removing the temporary substrate and the sacrificial film regions from the epitaxial structures by etching the sacrificial film regions through the gaps and the grooves.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
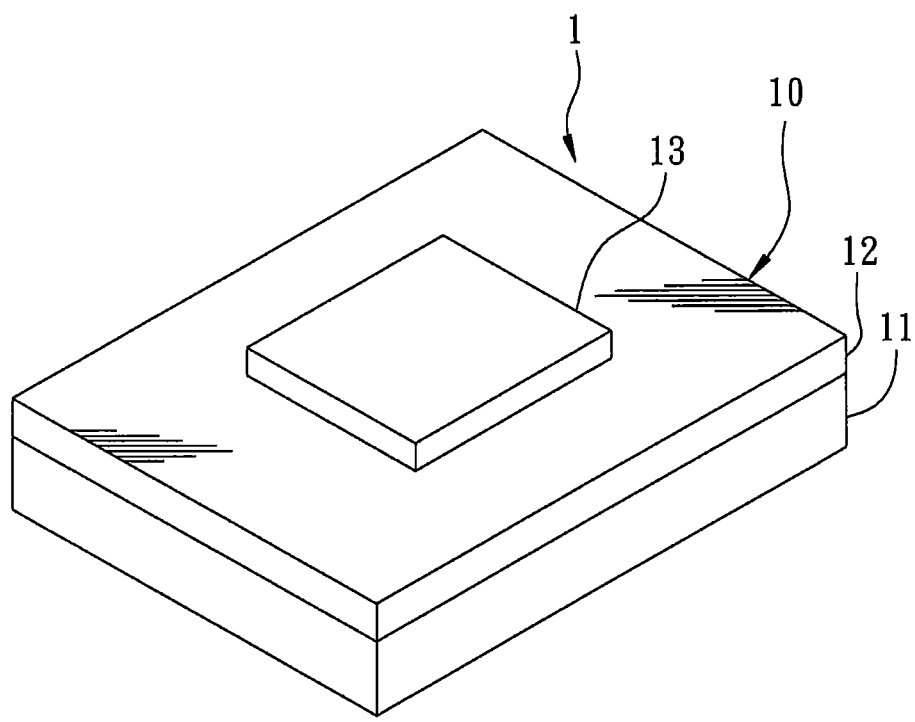
FIG. 1 is a perspective view of a conventional vertical-conducting light emitting diode.

Before the present invention is described in greater detail with reference to the accompanying preferred embodiments, it should be noted herein that like elements are denoted by the same reference numerals throughout the disclosure.

Figure 2:
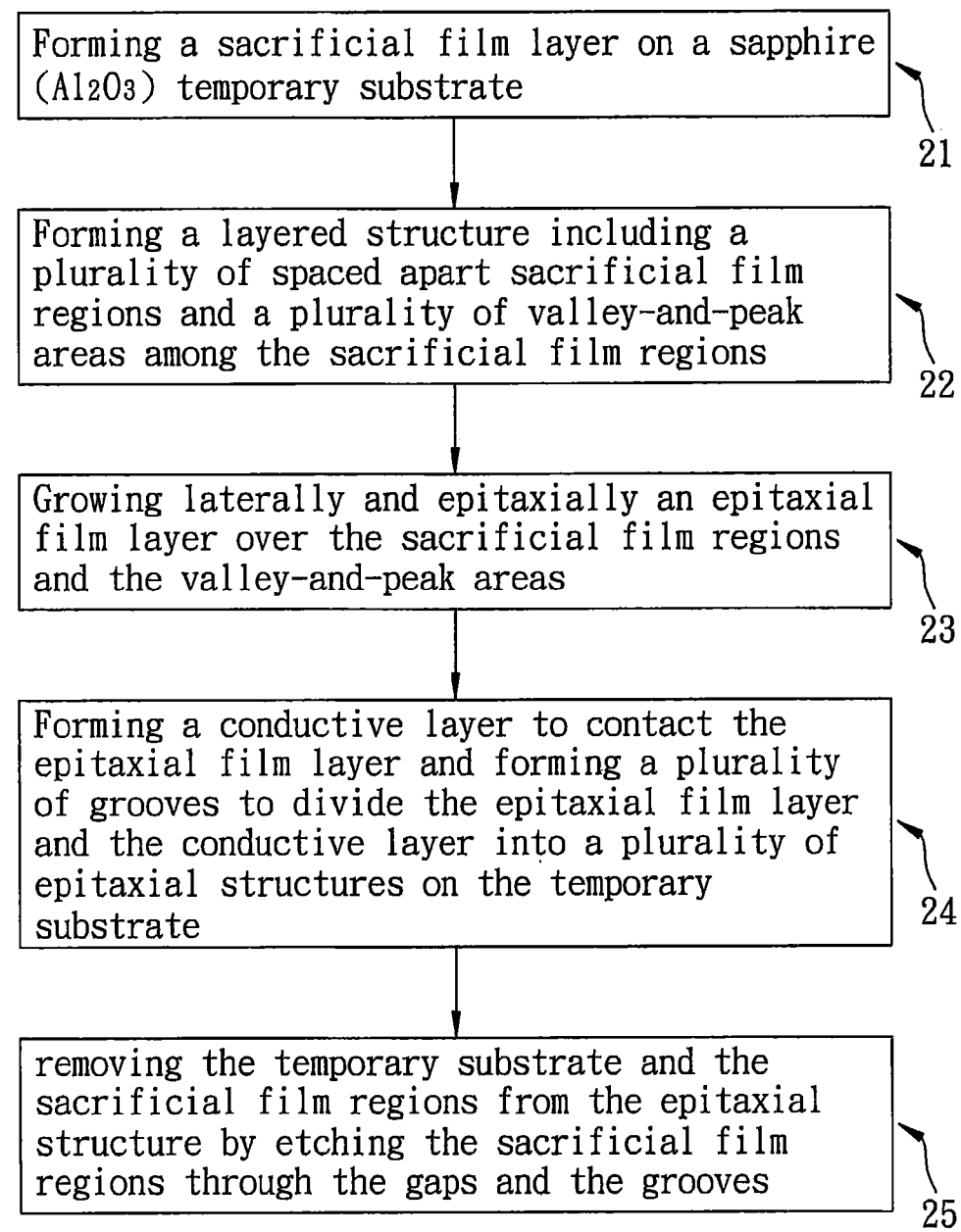
FIG. 2 is a flowchart showing the first preferred embodiment of a method for fabricating semiconductor devices according to the present invention.
Figure 3:
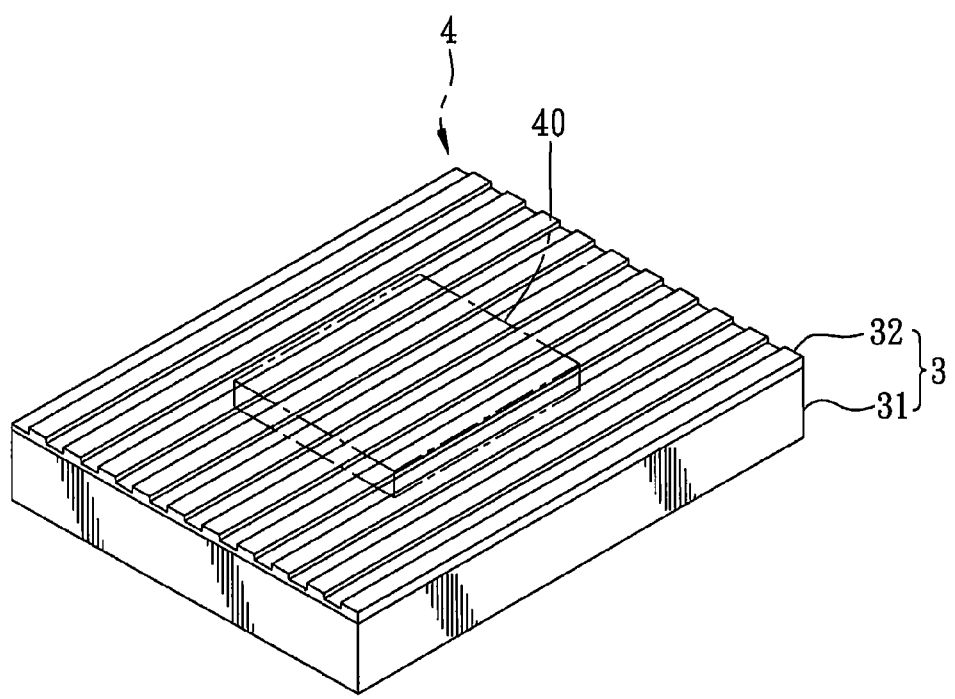
FIG. 3 is a perspective view of a semiconductor device fabricated according to the first preferred embodiment shown in FIG. 2.

Referring to FIGS. 2 and 3, an epitaxial structure 3 shown in FIG. 3 is formed according to the first preferred embodiment of a method for fabricating semiconductor devices of the present invention shown in FIG. 2. A semiconductor device 4 similar to that shown in FIG. 1 is obtained by forming an electrode 40 (shown in phantom lines in the drawing) on the epitaxial structure 3.

Referring to FIG. 3, the semiconductor device 4 according to the present invention includes the epitaxial structure 3, and the electrode 40 disposed on the epitaxial structure 3. The epitaxial structure 3 has a conductive member 31 and an epitaxial unit 32 disposed on the conductive member 31.

The epitaxial unit 32, the electrode 40, and the conductive member 31 are electrically connected, and electricity may be applied to the epitaxial unit 32 so that light may be emitted through an optoelectronic effect.

As shown in FIG. 2, the first preferred embodiment of a method for fabricating semiconductor devices according to the present invention includes steps 21 to 25.

Figure 4:
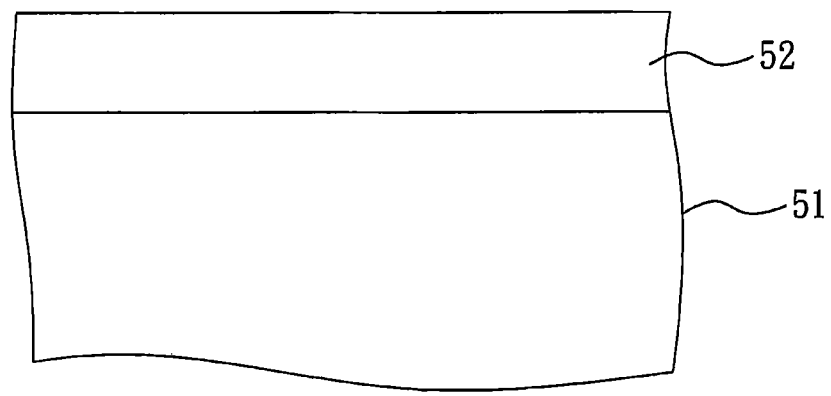
FIG. 4 is a schematic view for illustrating a step 21 of the first preferred embodiment shown in FIG. 2.

Referring to FIGS. 2 and 4, in step 21, a sacrificial film layer 52 that is made of, e.g., silicon oxide ($SiO_x$) is formed on a sapphire ($Al_2O_3$) temporary substrate wafer.

Figure 5:
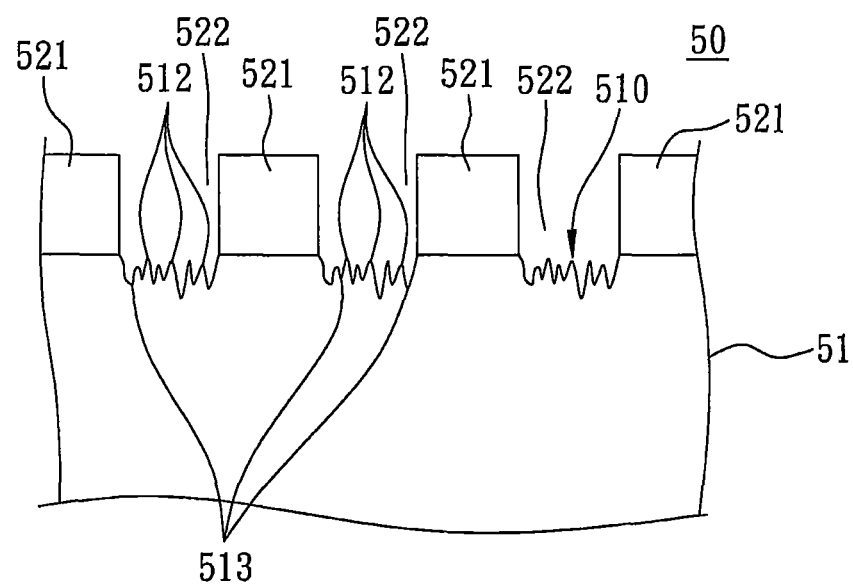
FIG. 5 is a schematic view for illustrating a step 22 of the first preferred embodiment shown in FIG. 2.

Referring to FIGS. 2 and 5, in step 22, a layered structure 50 including a plurality of spaced apart sacrificial film regions 521 and a plurality of valley-and-peak areas 510 among the sacrificial film regions 521 is formed. In this embodiment, the layered structure 50 is formed using lithography technology. Specifically, the sacrificial film layer 52 is patterned to form the sacrificial film regions 521 and a plurality of exposing regions 522 that expose areas of the temporary substrate 51. The areas of the temporary substrate 51 exposed by the exposing regions 522 are then roughened to form a plurality of peaks and valleys 512, 513. The exposing regions 522 and the peaks and valleys 512, 513 define the valley-and-peak areas 510. In this embodiment, the sacrificial film regions 521 are configured as a plurality of substantially parallel strips. The peaks and valleys 512, 513 are formed by etching and roughening the areas of the substrate 51 exposed by the exposing regions 522 using an inductively coupled plasma (ICP) process.

Figure 6:
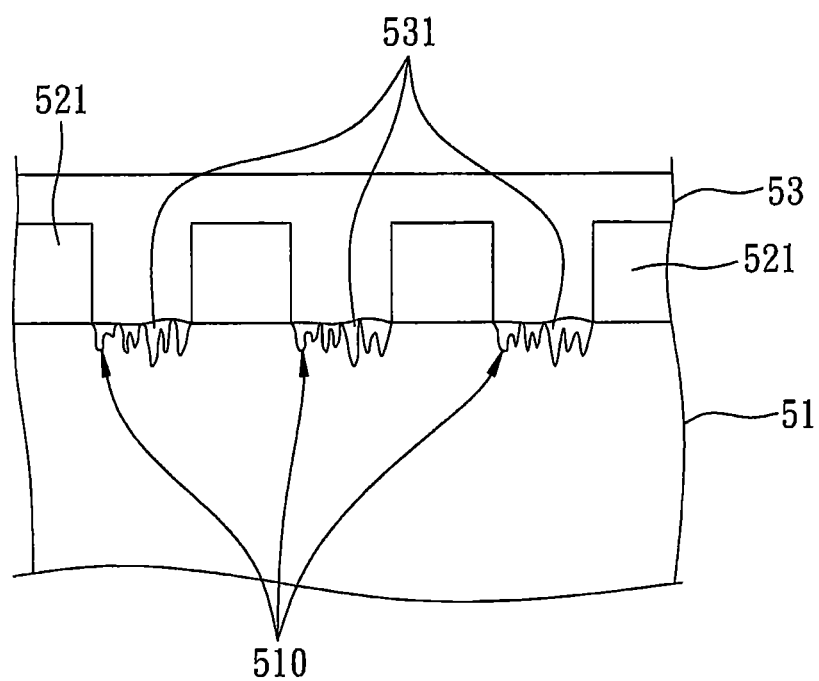
FIG. 6 is a schematic view for illustrating a step 23 of the first preferred embodiment shown in FIG. 2.
Figure 16:
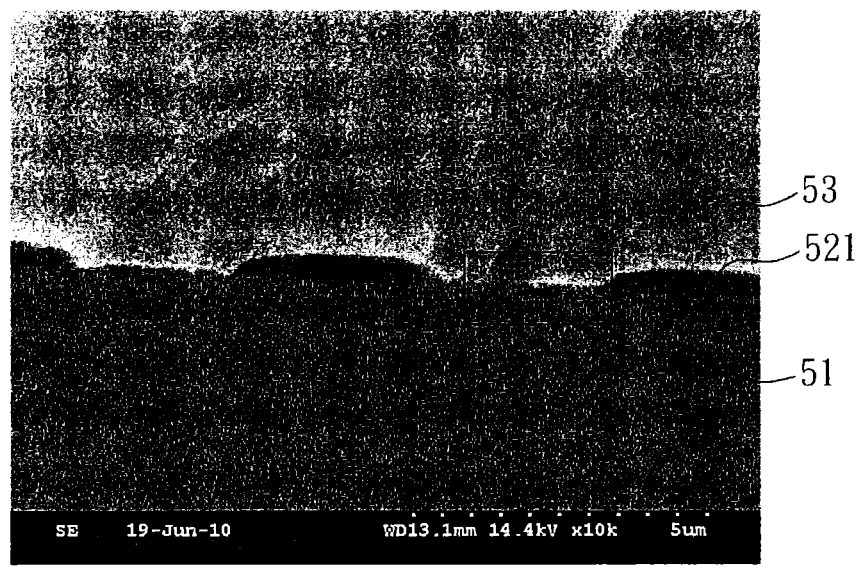
FIG. 16 is a photograph showing the structure of FIG. 6.
Figure 17:
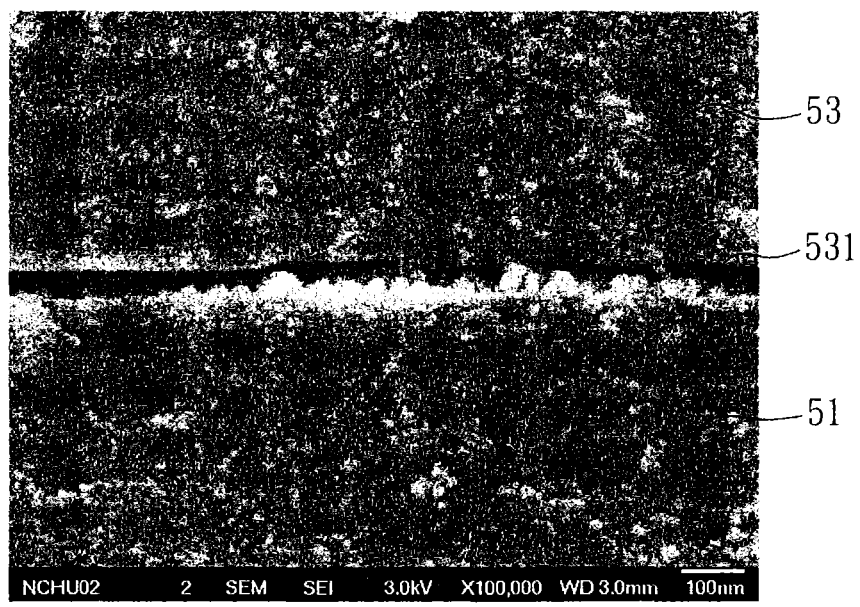
FIG. 17 is an enlarged image of a rectangular area shown in FIG. 16.

Referring to FIGS. 2 and 6, in step 23, an epitaxial film layer 53 that may be made of gallium nitride (GaN) series semiconductor material is laterally and epitaxially grown over the sacrificial film regions 521 and the valley-and-peak areas 510. Thus, a plurality of gaps 531 are formed among the epitaxial film layer 53 and the valley-and-peak areas 510. A photograph showing the structure of FIG. 6 is shown in FIG. 16. FIG. 17 is an enlarged image of a rectangular area shown in FIG. 16, which illustrates a detailed structure of the gaps 531. The presence of the gaps 531 can greatly reduce the substantial contact area and the connection strength between the epitaxial film layer 53 and the temporary substrate 51, thereby reducing the etching time when removing the epitaxial film layer 53 from the temporary substrate 51 in a subsequent step.

Figure 7:
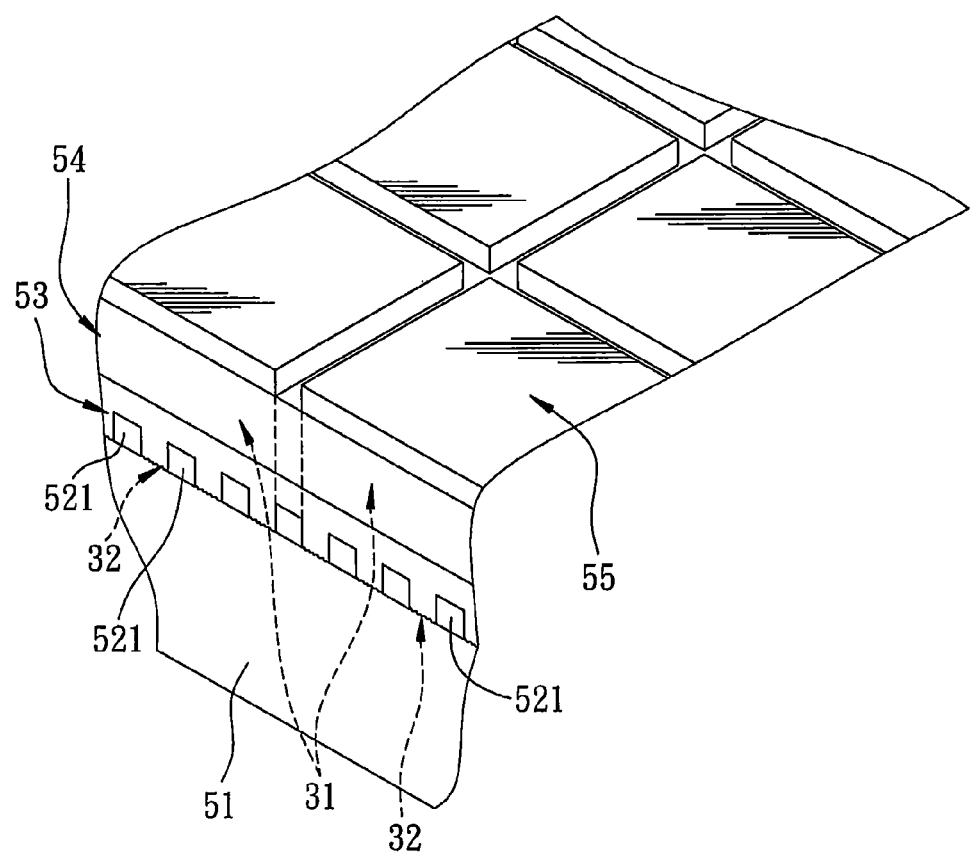
FIGS. 7 and 8 are perspective views for illustrating a step 24 of the first preferred embodiment shown in FIG. 2.
Figure 8:
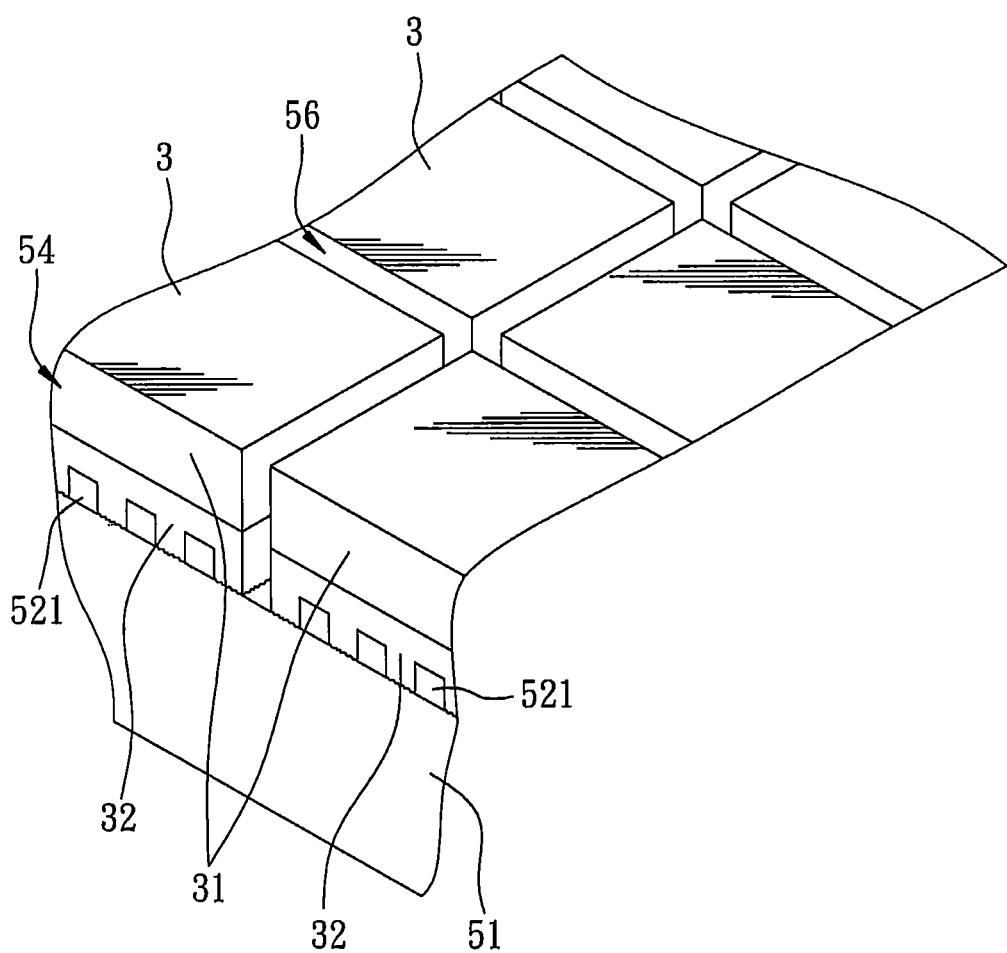

Referring to FIGS. 2, 7 and 8, in step 24, a conductive layer 54 is formed to contact the epitaxial film layer 53, and a plurality of grooves 56 are formed to divide the epitaxial film layer 53 and the conductive layer 54 into a plurality of epitaxial structures 3 on the temporary substrate 51. More specifically, after the conductive layer 54 is formed, a patterned mask 55 is formed on the conductive layer 54 by photolithography so that the patterned mask 55 covers partially a top face of the conductive layer 54, and the grooves 56 are formed by etching, e.g., dry etching, the conductive layer 54 that is not covered by the patterned mask 55 toward the epitaxial film layer 53 until a portion of the temporary substrate 51 is exposed, followed by removing the patterned mask 55. The epitaxial film layer 53 is divided into a plurality of epitaxial units 32 by the grooves 56. The conductive layer 54 is divided into a plurality of conductive members 31 by the grooves 56.

The epitaxial units 32 and the conductive members 31 cooperatively define the epitaxial structures 3 (see FIG. 8).

Figure 9:
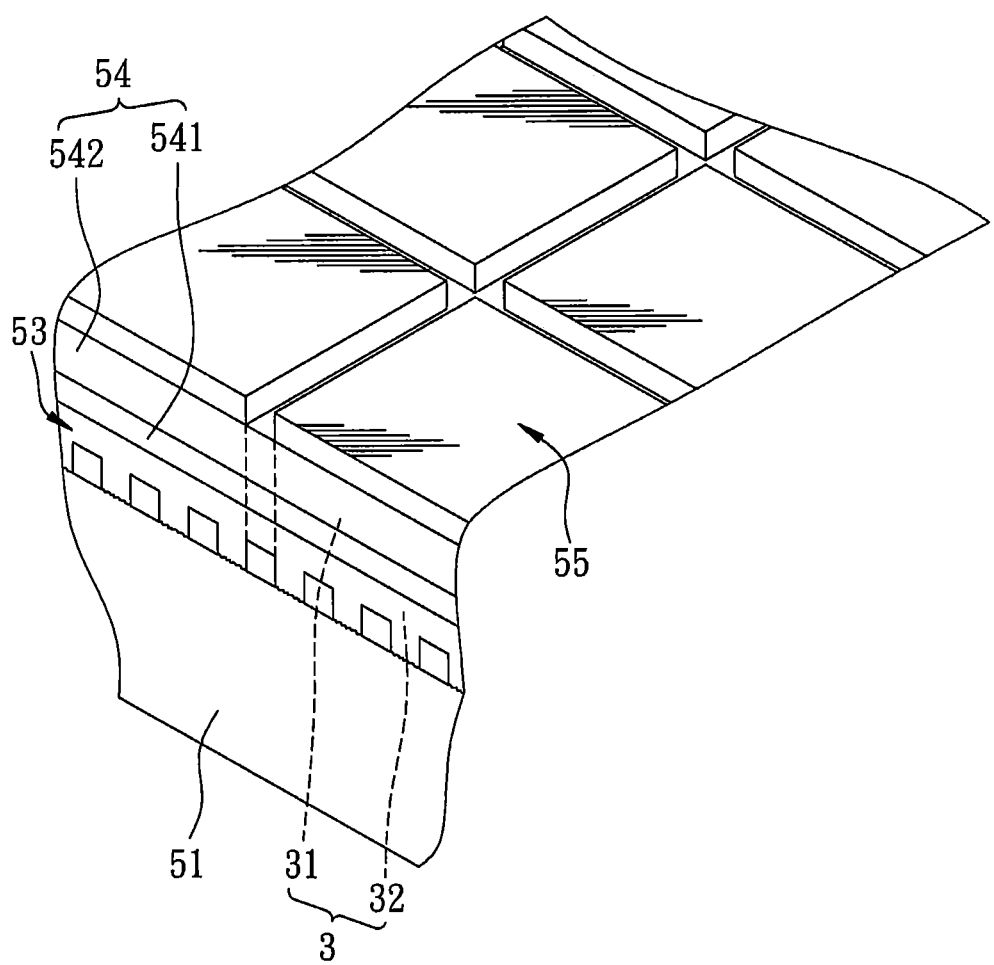
FIG. 9 is a perspective view for illustrating, in step 24, forming a conductive layer including a reflective conductive film and a conductive film.

In this embodiment, the conductive layer 54 has a single layer structure. However, referring to FIG. 9, the conductive layer 54 can be formed by forming a reflective conductive film 541 on the epitaxial film layer 53, followed by forming a conductive film 542 on the reflective conductive film 541. The reflective conductive film 541 is made of a metal, an alloy, or a dielectric material coated with a conductive material. Therefore, in addition to working with the electrode 40 for supplying electricity, the conductive layer 54 can also reflect light.

Figure 10:
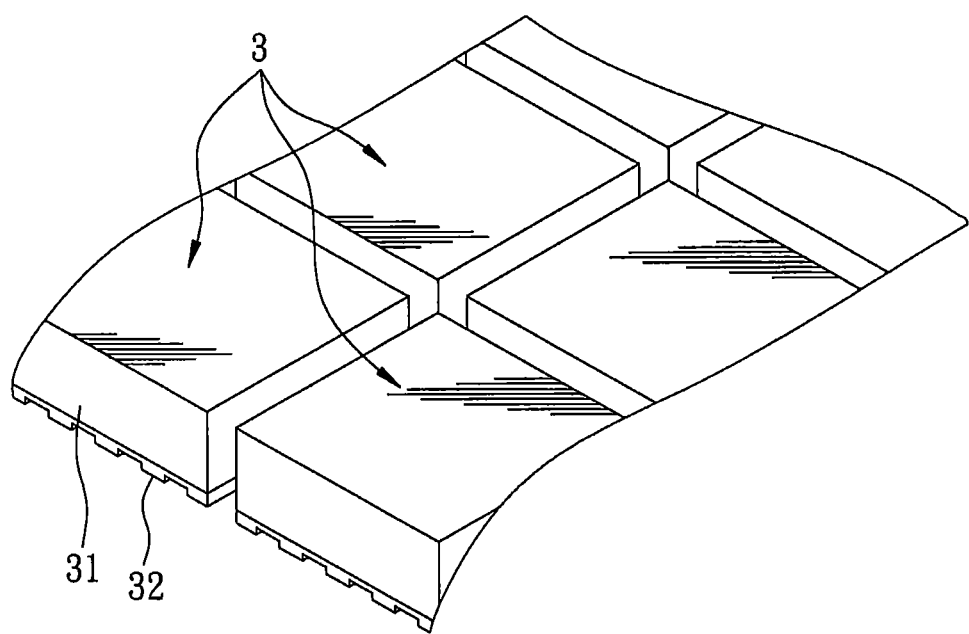
FIG. 10 is a perspective view for illustrating a step 25 of the first preferred embodiment shown in FIG. 2.

Referring to FIGS. 2 and 10, in step 25, the temporary substrate 51 and the sacrificial film regions 521 are removed from the epitaxial structures 3 by etching, e.g., wet etching, the sacrificial film regions 521 through the grooves 56 and the gaps 531. More specifically, an etching agent flows through the grooves 56 and reaches peripheries of the sacrificial film regions 521 to wet etch the sacrificial film regions 521. At this time, the etching agent will flow into interfaces of the epitaxial film layer 53 and the conductive member 31 through the gaps 531 so as to permit quick and simple removal of the epitaxial structures 3 from the temporary substrate 51.

Figure 11:
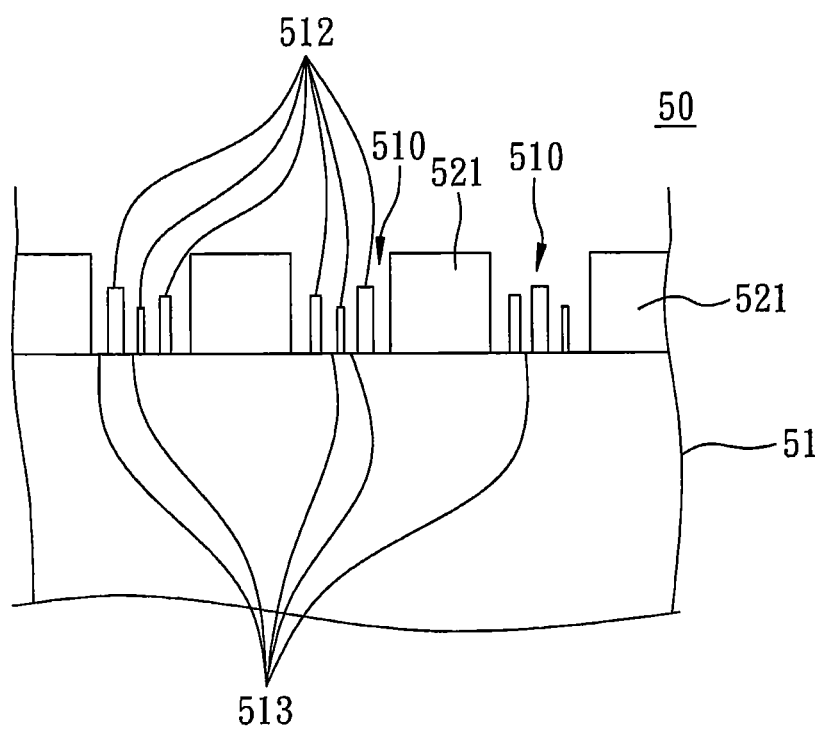
FIG. 11 is a schematic view for illustrating, in step 22 of the first preferred embodiment, lithographically etching a sacrificial film layer to form simultaneously the sacrificial film regions and the valley-and-peak areas.

In addition, although the temporary substrate 51 is roughened to form the peaks and valleys 512, 513 in step 22 of the first embodiment, in practice, the temporary substrate 51 may be roughened to form peaks and valleys 512, 513 on the temporary substrate 51 before the sacrificial film layer 52 is formed on the temporary substrate 51 in step 21. Optionally, the roughened temporary substrate 51 may be further roughened to increase the height differences between the peaks and valleys 512, 513 after the sacrificial film regions 521 are formed so as to provide the gaps 531 with a larger space to facilitate subsequent steps. Alternatively, as shown in FIG. 11, in step 22, the sacrificial film layer 52 may be lithographically etched to form simultaneously the sacrificial film regions 521 and the valley-and-peak areas 510. Each of the valley-and-peak areas 510 has the plurality of peaks and valleys 512, 513. The temporary substrate 51 is exposed from the valleys 513 in the valley-and-peak areas 510. Alternatively, step 22 can be performed by combination of the above-mentioned ways. Of course, the etching process is not limited to an ICP process, and other processes, such as wet etching process, reactive ion etching process and the like may be used.

Figure 12:
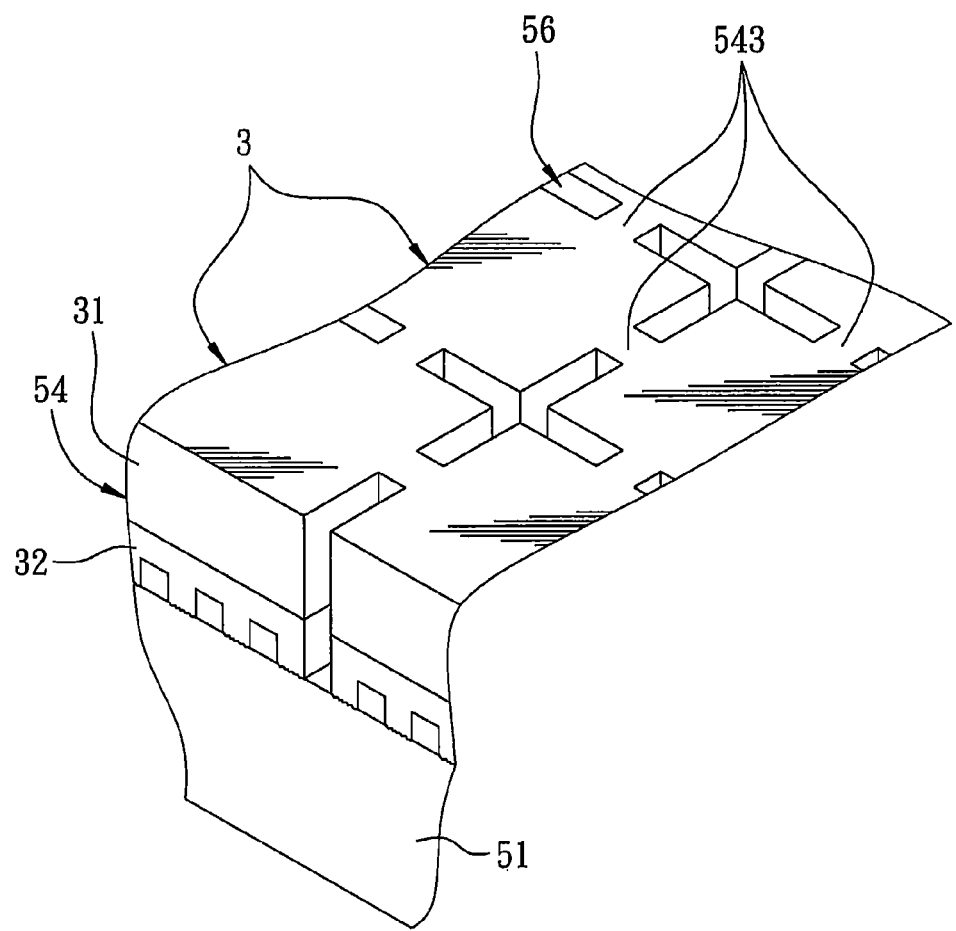
FIG. 12 is a perspective view for illustrating a plurality of interconnected conductive members connected by bridging sections.

Referring to FIG. 12, the patterned mask (not shown) may be a structure having interconnected portions so that adjacent ones of the conductive members 31 are connected to each other by bridging sections 543. Therefore, a plurality of interconnected epitaxial structures 3 are obtained after removal from the temporary substrate 51, and various semiconductor devices 4 may be obtained by forming the electrodes 40 and performing subsequent cutting.

In view of the above, it is understood that in accordance with the method for fabricating semiconductor devices of this invention, the removal speed of the temporary substrate 51 is increased by the sacrificial film regions 521. Moreover, by virtue of the formation of the valley-and-peak areas on the temporary substrate 51, the gaps 531 can be formed at the interface of the epitaxial film layer 53 and the temporary substrate 51 when the epitaxial film layer 53 is formed. Therefore, the epitaxial structures 3 can be further quickly removed from the temporary substrate 51.

In the present invention, the formation of the gaps 531 not only reduces the contact surface area between the epitaxial film layer 53 and the temporary substrate 51 and the connection strength, but also increases the contact surface area of the etching agent, thereby permitting quick removal of the epitaxial structures 3 from the temporary substrate 51. In addition, since the method does not involve a grinding process which potentially results in residual stress, the structural integrity of the epitaxial structures 3 can be ensured, thereby improving the performance of the semiconductor device 4 made according to the method of the present invention.

Figure 13:
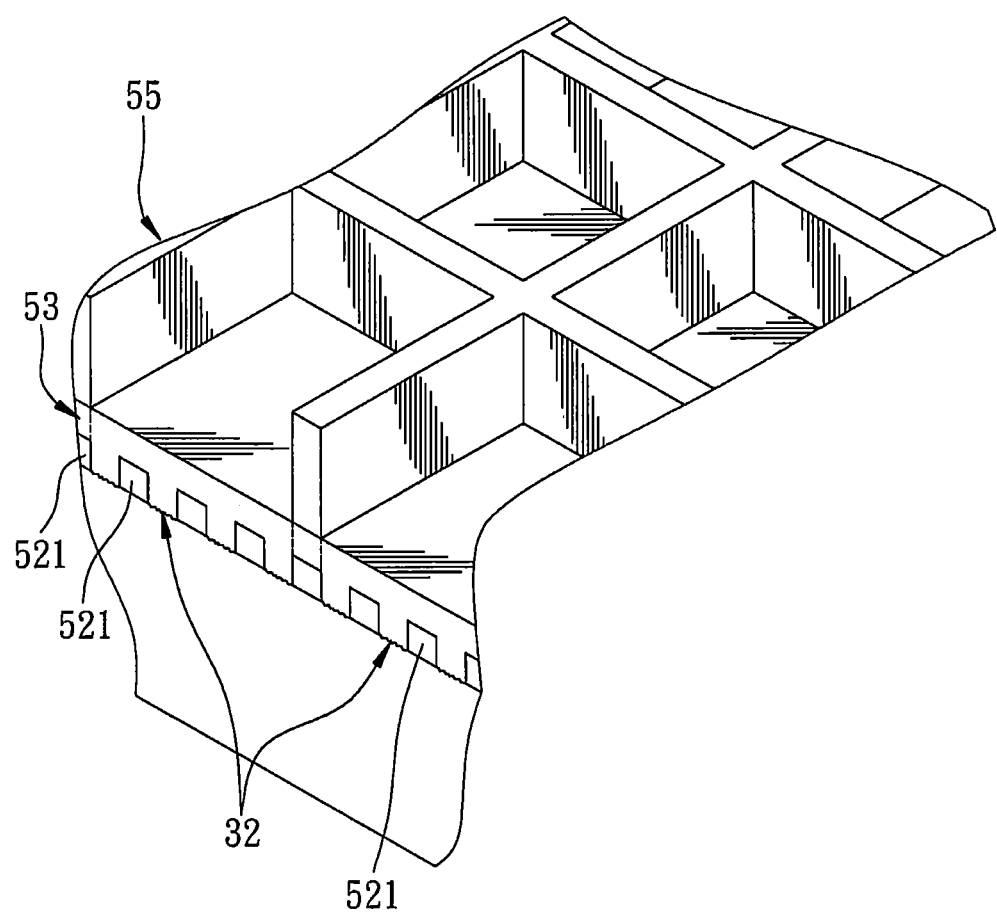
FIGS. 13 and 14 are perspective views for illustrating a step 24 of a method for fabricating semiconductor devices according to a second preferred embodiment of the present invention.
Figure 14:
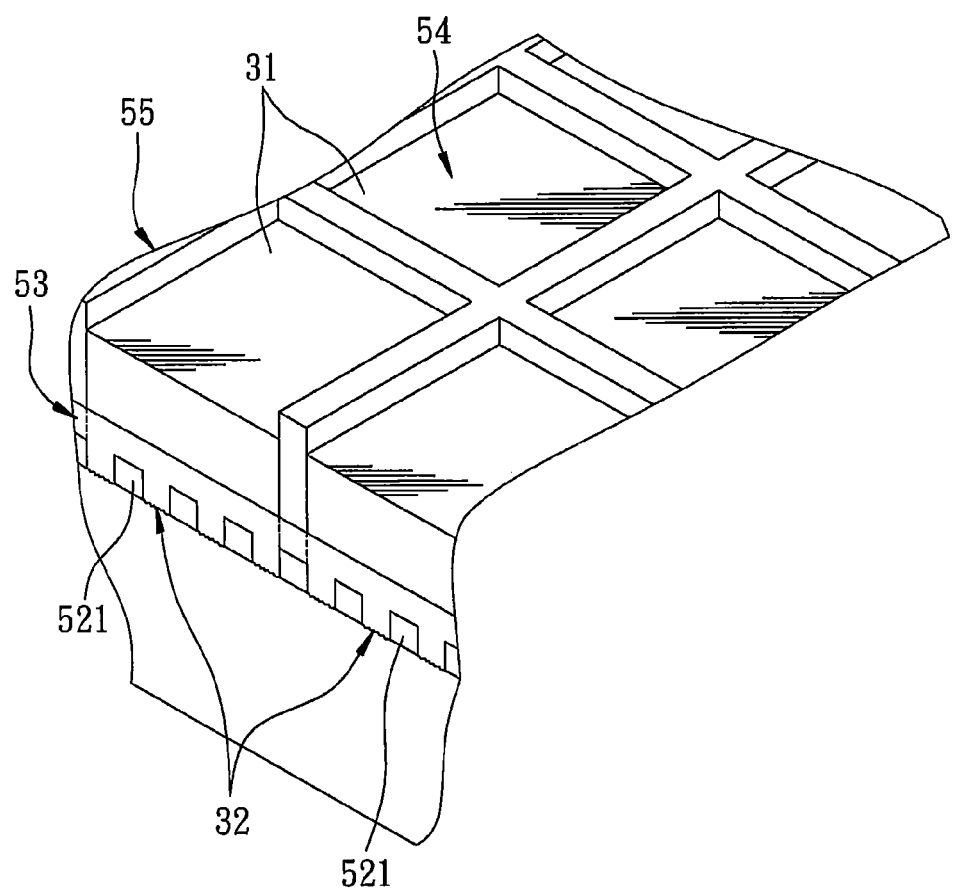

Referring to FIGS. 13 and 14, the second preferred embodiment of a method for fabricating semiconductor devices according to the present invention is shown. The method of the second preferred embodiment is similar to that of the first embodiment, except that, in step 24, a patterned mask 55 is formed over the epitaxial film layer 53 using lithography technology. The patterned mask 55 covers partially the epitaxial film layer 53 and defines a plurality of through holes to expose a plurality of epitaxial surface regions, respectively. Next, as shown in FIG. 14, a plurality of spaced apart conductive members 31 are formed individually on the epitaxial surface regions in the through holes. Finally, the patterned mask 55 is removed, the spaced apart conductive members 31 are then used as an etch mask, and a part of the epitaxial film layer 53 and the sacrificial film regions 521 beneath the patterned mask 55 are removed until a portion of the temporary substrate 51 therebeneath is exposed so as to form a plurality of grooves 56 similar to those illustrated in FIG. 8. The epitaxial film layer 53 is divided into a plurality of the epitaxial units 32 by the grooves 56. The epitaxial units 32 and the conductive members 31 cooperatively define the epitaxial structures 3.

Unlike the first preferred embodiment, in this embodiment, the individual conductive members 31 are directly formed in the through holes defined by the patterned mask 55, and then are used as an etch mask during etching of the epitaxial film layer 53, thereby dividing the epitaxial film layer 53 into a plurality of epitaxial units 32.

Figure 15:
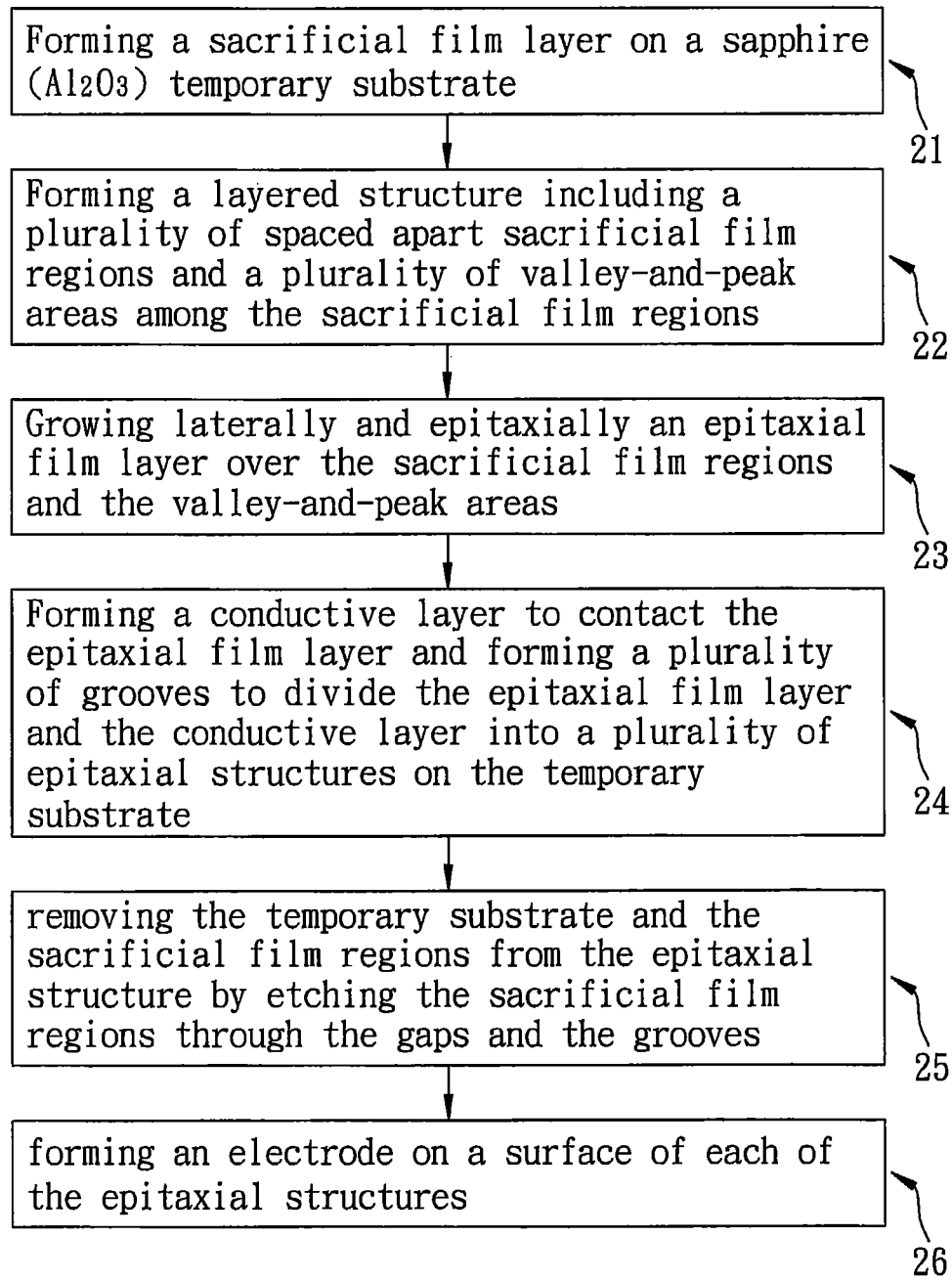
FIG. 15 is a flowchart showing a third preferred embodiment of a method for fabricating semiconductor devices according to the present invention.

Referring to FIG. 15, a method for fabricating semiconductor devices according to a third preferred embodiment of the present invention is shown. The method of the third preferred embodiment is similar to that of the first and second embodiments, except that, in the third preferred embodiment, the method further comprises, after the step 25, a step 26 of forming an electrode 40 on a surface of each of the epitaxial structures 3. Therefore, at least one semiconductor device 4 that can be actuated by electricity supplied through the electrode 40 and the conductive member 31 is obtained.

To sum up, in the method for fabricating semiconductor devices of the present invention, by virtue of simply dividing a plurality of epitaxial structures 3 by the grooves 56, and cooperatively using the sacrificial film regions 521, the valley-and-peak areas 510, and the gaps 531 formed between the temporary substrate 51 and the epitaxial film layer 53, the removal speed of the temporary substrate 51 can be increased. Therefore, the semiconductor device can be fabricated in a timesaving and cost effective manner without encountering any residual stress problem.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for fabricating semiconductor devices, comprising:
   (a) forming a layered structure that includes a temporary substrate, a plurality of spaced apart sacrificial film regions on the temporary substrate, and a plurality of valley-and-peak areas among the sacrificial film regions;
   (b) growing laterally and epitaxially an epitaxial film layer over the sacrificial film regions and the valley-and-peak areas, wherein gaps are formed among the epitaxial film layer and the valley-and-peak areas;
   (c) forming a conductive layer to contact the epitaxial film layer;
   (d) forming a plurality of grooves to divide the epitaxial film layer and the conductive layer into a plurality of epitaxial structures on the temporary substrate; and
   (e) removing the temporary substrate and the sacrificial film regions from the epitaxial structures by etching the sacrificial film regions through the gaps and the grooves.

2. The method of claim 1, wherein the forming of the layered structure includes the steps of forming and patterning a sacrificial film layer on the temporary substrate to form the sacrificial film regions and a plurality of exposing regions that expose areas of the temporary substrate, and roughening the areas of the temporary substrate exposed by the exposing regions to form a plurality of peaks and valleys, the exposing regions and the peaks and valleys defining the valley-and-peak areas.

3. The method of claim 1, wherein the forming of the layered structure includes the steps of roughening the temporary substrate to form peaks and valleys on the temporary substrate before a sacrificial film layer is formed on the temporary substrate, patterning the sacrificial film layer to form the sacrificial film regions and a plurality of exposing regions that expose areas of the temporary substrate, the peaks and valleys exposed via the exposing regions defining the valley-and-peak areas.

4. The method of claim 1, wherein the forming of the layered structure includes the steps of forming and lithographically etching a sacrificial film layer on the temporary substrate to form simultaneously the sacrificial film regions and the valley-and-peak areas, each of the valley-and-peak areas having a plurality of peaks and valleys, the temporary substrate being exposed from the valleys in the valley-and-peak areas.

5. The method of claim 1, further comprising, before step (d), forming over the epitaxial film layer a patterned mask that covers partially the epitaxial film layer, in step (d), the conductive layer that is formed on the epitaxial film layer being divided into a plurality of conductive members by the patterned mask.

6. The method of claim 5, wherein, in step (d), forming of the grooves is conducted by removing the patterned mask and removing a part of the epitaxial film layer and the sacrificial film regions beneath the patterned mask until a portion of the temporary substrate therebeneath is exposed, the epitaxial film layer being divided into a plurality of epitaxial units by the grooves, the epitaxial units and the conductive members cooperatively defining the epitaxial structures.

7. The method of claim 1, further comprising, after step (e), (f) forming an electrode on a surface of each of the epitaxial structures.

8. The method of claim 1, wherein, in step (c), forming of the conductive layer is conducted by forming a reflective conductive film on the epitaxial film layer, followed by forming a conductive film on the reflective conductive film.

* * * * *